United States Patent [19]

Cho et al.

[11] Patent Number: 4,506,239
[45] Date of Patent: Mar. 19, 1985

[54] COMPOUND SURFACE ACOUSTIC WAVE MATCHED FILTERS

[75] Inventors: Frederick Y. Cho, Scottsdale, Ariz.; Dylan F. Williams, Berkeley, Calif.

[73] Assignee: Motorola, Inc., Schaumburg, Ill.

[21] Appl. No.: 436,204

[22] Filed: Oct. 25, 1982

[51] Int. Cl.³ .................. H03H 9/64; H03H 9/145
[52] U.S. Cl. ........................ 333/196; 310/313 C; 333/154; 333/193; 364/821; 375/96
[58] Field of Search ..................... 333/150–155, 333/193–196; 310/313 R, 313 A, 313 B, 313 C, 313 D; 364/821; 375/1, 96

[56] References Cited

U.S. PATENT DOCUMENTS

| | | | |
|---|---|---|---|
| 3,376,572 | 4/1968 | Mayo | 310/313 B |
| 3,633,132 | 1/1972 | Hartemann | 310/313 C X |
| 3,675,163 | 7/1972 | Hartman et al. | 333/150 |
| 3,845,419 | 10/1974 | Nudd | 333/154 |
| 3,903,486 | 9/1975 | Bert et al. | 333/152 |
| 3,931,598 | 1/1976 | Bongianni | 333/150 |
| 4,037,159 | 7/1977 | Martin | 375/96 X |
| 4,427,954 | 1/1984 | Veith et al. | 333/195 X |

OTHER PUBLICATIONS

Smith–"Saw Filters for CPSM Spread Spectrum Communication", National Telecommunications Conference, Houston, TX, U.S.A., (Nov. 30–Dec. 4, 1980), CH1539-6/80/0000-0109, ©1980 IEEE, pp. 22.1.1–22.1.6.

Primary Examiner—Marvin L. Nussbaum
Attorney, Agent, or Firm—Jonathan P. Meyer

[57] ABSTRACT

Compound surface acoustic wave matched filters comprise chirp-biphase and biphase code multiplex transducer pairs on piezoelectric substrates. Both alternatives offer significantly improved processing gain when compared with conventional biphase filters. The advantage is realized by convolving the correlation peak of the chirp or biphase input transducer on the response of the conventional biphase output transducer, thus achieving a large processing gain with a minimum number of transducer electrodes.

13 Claims, 7 Drawing Figures

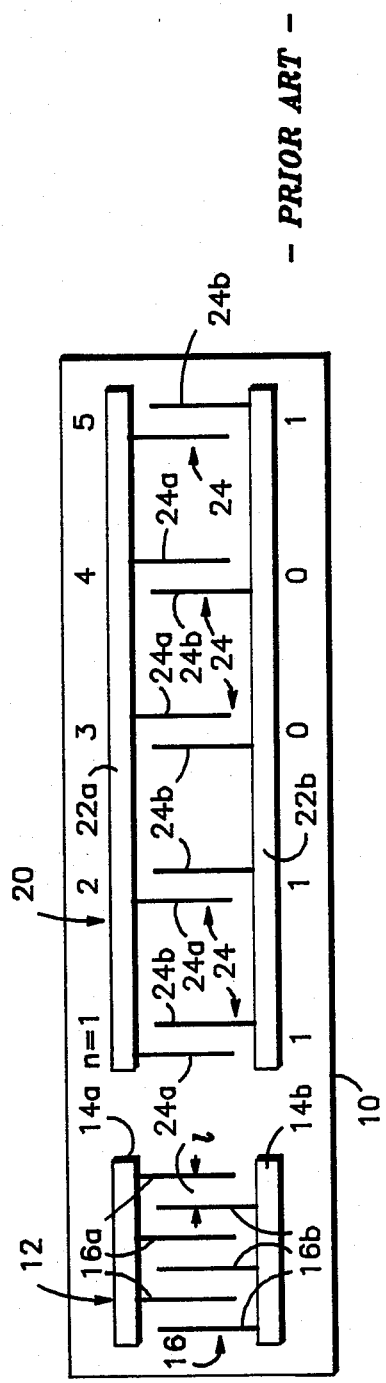
FIG. 1A — PRIOR ART —
FIG. 1B
FIG. 1C
FIG. 1D

COMPOUND SURFACE ACOUSTIC WAVE MATCHED FILTERS

FIELD OF THE INVENTION

The present invention relates, in general, to matched filters for use in secure and long range communications systems and the like. More particularly, the invention relates to large processing gain chirp-biphase and biphase code multiplex surface acoustic wave filters.

BACKGROUND OF THE INVENTION

In long range and secure radio frequency communications systems it is often desirable to be able to detect a signal which is at or below a noise level. In secure communications systems in particular, it may be necessary to process a transmitted signal so as to spread it into the noise background and to reconstitute the signal at a receiver by applying an autocorrelation process. Surface acoustic wave (SAW) matched filters are widely used to perform these functions.

A particular type of SAW filter useful for these purposes is a biphase matched filter. The signal input to a biphase filter is spread in time and is periodically phase inverted according to a code determined by the SAW transducers. The degree of security of a biphase processed signal is determined by the number of bits in the code, which corresponds to the number of electrode pairs in the biphase transducer. However, very large numbers of electrode pairs create multiple reflections and regeneration of the surface acoustic wave signal which degrade device performance, thus limiting the degree of security obtainable with acceptable levels of spurious signals.

SUMMARY OF THE INVENTION

Accordingly, it is an object of the present invention to provide an improved SAW matched filter.

It is a further object of the present invention to achieve a high degree of signal security using a reduced number of transducer electrodes.

A particular embodiment of the present invention comprises a chirp-biphase SAW matched filter. The input transducer is of the frequency dispersive type commonly referred to as a chirp transducer and the output transducer is a biphase transducer. The biphase modulated correlation peaks of the chirp signal are convolved with the biphase transducer of the receiver correlator to provide a high degree of signal expansion/compression with a relatively small number of transducer electrodes. The processing gain is equal to the time-bandwidth product of the chirp transducer and the number of bits of the biphase coded transducer.

An alternate embodiment of the present invention comprises a biphase code multiplex SAW matched filter. Both the input and output transducers are of the biphase type, one having an N bit code and the other having an M bit code. The processing gain realized is the same as a conventional biphase filter having an M×N bit code while requiring only N+M electrodes.

Either chirp-biphase or biphase code multiplex filters may be used in pairs to provide signal security in a communications system. A first filter is used at the transmitting station to spread the transmitted signal into the noise background and the time inverse of the first filter is used at the receiving station to provide a correlation peak corresponding to the original signal. Both chirp-biphase and biphase code multiplex filters provide a significant advantage over prior art SAW matched filters in the tradeoff between signal security and spurious signal level.

These and other objects and advantages of the present invention will be apparent to one skilled in the art from the detailed description below taken together with the drawings.

BRIEF DESCRIPTION OF THE DRAWINGS

FIG. 1A is a top plan view of a five-bit biphase SAW filter of the prior art;

FIG. 1B graphically depicts an electrical signal input to the filter of FIG. 1A;

FIG. 1C graphically depicts the surface acoustic wave signal generated in response to the input signal of FIG. 1B;

FIG. 1D graphically depicts the electrical signal output by the SAW filter of FIG. 1A;

DETAILED DESCRIPTION OF THE INVENTION

Figure 2:
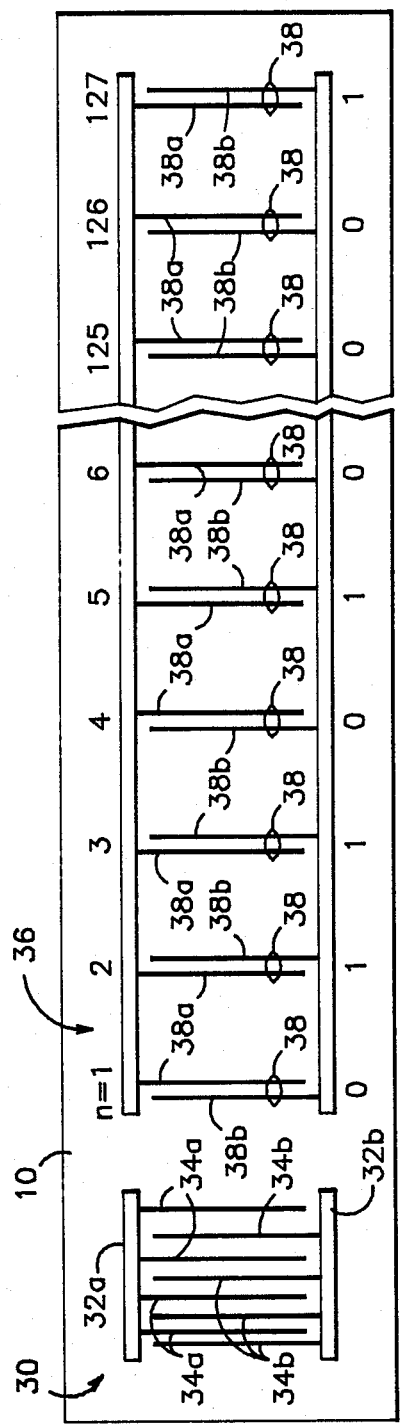
FIG. 2 is a top plan view of a chirp-biphase SAW filter according to the principles of the present invention.

Referring to FIGS. 1A, 1B, 1C and 1D the structure and function of a five-bit biphase SAW filter of the prior art are described. A substrate 10 forms the basis for the filter. It is chosen from among the group of suitable piezoelectric substrates such as lithium niobate and quartz. An input transducer 12 disposed on substrate 10 comprises a pair of parallel, spaced-apart connection bars 14a and 14b and a plurality of electrodes 16. As will be the case with all transducers described herein, input transducer 12 is customarily constructed by depositing a metal film on substrate 10, masking the desired pattern onto the film, and removing the unprotected portions of the film. Many variations on this basic process will be apparent to one skilled in the art. Transducers described herein are referred to as "input" or "output" transducers; however, it is well known that, in the general case, the roles of the two transducers may be reversed without significant effect on overall device efficiency. Each of a first set of electrodes 16a is connected to bar 14a. Electrodes 16a are interleaved with electrodes 16b, which are connected to bar 14b. Each electrode 16 is spaced from its neighbors by a distance l.

An input electrical signal as shown in FIG. 1B, when applied to input transducer 12, results in surface acoustic waves having a waveform as shown in FIG. 1C propagating on substrate 10. The electrode spacing l determines the wavelength of the surface acoustic wave signal ($l = \frac{1}{2} \lambda$) and the number of full cycles in the waveform is determined by the number of electrodes 16. Each electrode 16a may be considered to be paired with an adjacent electrode 16b, thus transducer 12 is seen to have three electrode pairs. In addition, the spacing between adjacent pairs in transducer 12 is identical to the spacing between the electrodes within a pair. Each electrode pair, when stimulated by the input signal (FIG. 1B) produces a surface acoustic wave having a wavelength equal to 2l, having a duration of one full cycle and propagating with a velocity determined by the properties of substrate 10. Since transducer 12 has three electrode pairs spaced as described above, the surface waves generated by the three pairs combine to produce the waveform shown in FIG. 1C. In this sense, the surface acoustic wave signal generated by transducer 12 is said to be time expanded by a factor of three with respect to the input electrical signal (FIG. 1B). The amplitudes of the waveforms illustrated are entirely arbitrary. As is well known, the surface acoustic wave signal propagates in a direction substantially perpendicular to electrodes 16 of transducer 12. The time duration of the surface acoustic wave signal, that is the time required or the entire signal to pass a given point on substrate 10, is determined by the wavelength, the number of cycles and the propagation velocity ($Y = \lambda \cdot$ number of cycles $\div v$) and is used in determining the degree of signal security as is described below. The time duration of the surface acoustic wave signal generated by an electrical signal comprising a single impulse is called the impulse response time.

An output transducer 20 disposed on substrate 10 is responsive to the surface acoustic wave signal (FIG. 1C) to produce an output electrical signal (FIG. 1D). Transducer 20 comprises a pair of connection bars 22a and 22b and five electrode pairs 24. Each electrode pair 24 comprises an electrode 24a connected to connection bar 22a and an electrode 24b connected to connection bar 22b. Within an electrode pair 24, electrodes 24a and 24b are spaced a distance 1 apart and successive electrode pairs 24 are spaced apart by a distance substantially equal to the length of input transducer 12. Thus, no two electrode pairs 24 will be influenced by the surface acoustic wave signal (FIG. 1C) simultaneously. It is said of the two transducers that the bit time of output transducer 20 is equal to the impulse response time of input transducer 12. The first electrode pair, labeled n=1, has electrode 24a in front of electrode 24b while the third electrode pair has electrode 24b in front of electrode 24a. Thus, the output electrical signals generated by the first and third electrode pairs will be 180 degrees out of phase in addition to being spaced in time. The waveform shown in FIG. 1D illustrates the electrical output signal by the particular combination of positively and negatively phased electrode pairs of output transducer 20. As is apparent, the output waveform is merely the signals produced by each electrode pair 24 in succession, with the phase reversals determined by the bit code transducer 20. Transducer 20 is conventionally referred to as a five-bit biphase transducer with a code of 11001.

The mechanism used to reconstitute the original input signal at the receiving station is illustrated by considering inputting an acoustic signal having a waveform represented by FIG. 1D to the time inverse of transducer 20, that is, a biphase coded transducer having a code of 10011. When the acoustic signal has propagated so as to exactly underlie the transducer, the phases of the signal and of the transducer electrode pairs will match, thus producing a peak electrical output. On either side of this peak are sidelobes of much lower amplitude caused by the various out-of-phase contributions of the electrodes during the time when the acoustic signal is not correctly matched up with the transducer electrodes to produce a peak.

The degree of signal security provided by a SAW matched filter is commonly measured by the processing gain of the device. The processing gain, in dB, of a biphase filter of the type described above is approximately equal to a 10 log N, where N is the number of electrode pairs in the biphase transducer. N is also referred to as the number of bits. Therefore, a 127 bit conventional biphase filter would have a processing gain of approximately 21 dB. As is apparent, adding electrodes increases the processing gain relatively slowly. However, well known processes which degrade the performance of all SAW devices increase in magnitude more rapidly than the processing gain. Specifically, a surface acoustic wave encountering an electrode is only partially converted to an electrical signal. The energy is also partially reflected, generating new surface acoustic waves. The effect of the multiple reflections from hundreds or thousands of electrodes contributes to an unacceptable level of spurious signals if too much processing gain is designed into a biphase SAW filter according to the prior art.

Referring now to FIG. 2, a compound matched SAW filter according to the principles of the present invention is shown in top plan view. A piezoelectric substrate 10 forms the basis for the filter, as before. An input transducer 30 is disposed on substrate 10 and adapted to respond to an input electrical signal and to generate surface acoustic waves thereon. Input transducer 30 comprises a pair of parallel spaced-apart connection bars 32a and 32b. A first set of electrodes 34a, connected to connection bar 32a, is interleaved with a second set of electrodes 34b, connected to connection bar 32b. The inter-electrode spacing varies from a minimum value at one end of transducer 30 to a maximum value at the other end thereof. Since the spacing between the electrodes determines the wavelength (and thus the frequency) of the surface acoustic wave signal, the surface acoustic wave signal generated by transducer 30 will be frequency dispersed, in addition to being time expanded, with respect to the electrical input signal. The security of a chirp processed signal lies in the fact that only a transducer with the inverse of the spacing pattern of the encoding transducer can produce a correlation peak corresponding to the input electrical signal from the frequency dispersed signal. The processing gain of a chirp filter is approximately equal to 10 log YB, where Y is the time duration of the surface acoustic wave signal as defined above and B is the bandwidth of the chirp filter. The product YB is referred to as the time-bandwidth product. For instance, a chirp transducer designed to operate at a center frequency of 230 MHz which spreads the surface acoustic waves over a bandwidth of 46 MHz (20%) and produces a surface acoustic wave signal with a time duration of 0.087 μsec has a time-bandwidth product of 4. Since the frequency of the acoustic signal is related to the wavelength thereof, the range of electrode spacings in the chirp transducer gives the bandwidth of the device.

An output transducer 36 on substrate 10 responds to the surface acoustic wave signal generated by input transducer 30 and generates an output electrical signal which is time expanded and phase coded with respect to the surface acoustic wave signal. Transducer 36 is a 127-bit biphase transducer having an arbitrary bit code. As before, each electrode pair 38 comprises an electrode 38a and an electrode 38b. Each electrode pair 38 is spaced from adjacent pairs by a distance substantially equal to the length of input transducer 30, so that the output electrical signal consists of the serial contributions of each of the 127 electrode pairs. The time expanded and frequency dispersed surface acoustic wave signal produces a responsive electrical signal from each electrode pair 38 which has the same waveform, so the total output electrical signal produced by transducer 36 is simply 127 repetitions of that waveform with the phase inversions determined by the bit code of transducer 36. Since the incoming acoustic wave has various wavelengths the electrode spacing within each pair 38 cannot be perfectly matched to the wavelength; however, a spacing is chosen to correspond to an intermediate value of the range of wavelengths generated by transducer 30 and the losses are acceptable.

The combination of a chirp transducer and a biphase transducer as described above is referred to as a chirp-biphase filter. It is found that, instead of being additive, the processing gain of the two transducers is multiplicative. That is, the total processing gain is approximately equal to 10 log YBN. In the example shown, a chirp transducer having a time-bandwidth product of 4 combined with a 127 bit biphase transducer has a processing gain of approximately 10 log 508, or 27 dB. This compares with 21 dB for the same biphase transducer combined with a conventional input transducer and 24 dB for a 255 bit conventional biphase filter. As is apparent, the ability to achieve high processing gain with many fewer transducer electrodes than in prior art filters is a very significant advantage in view of the increased levels of spurious signals caused by increasing the number of electrodes.

Figure 3:
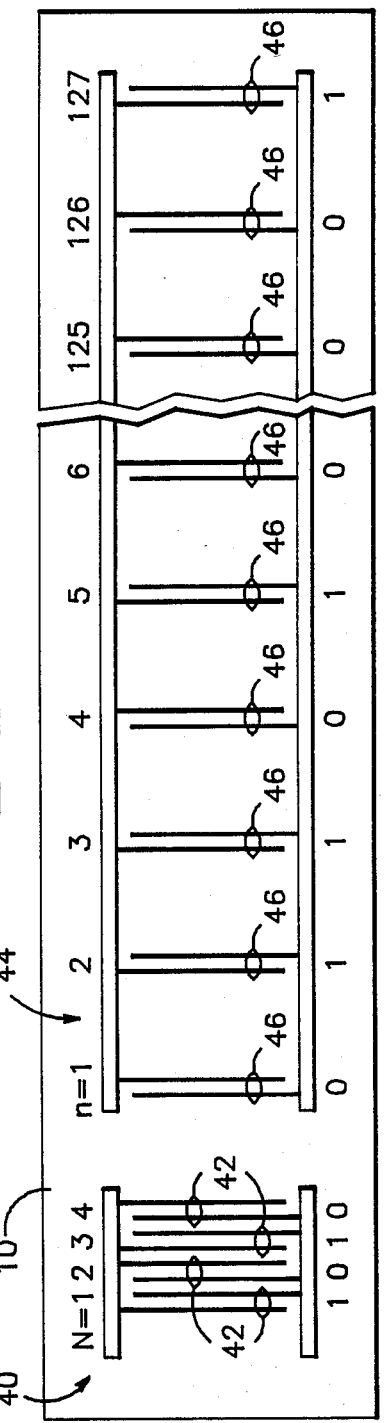
FIG. 3 is a top plan view of a biphase code multiplex SAW filter according to the principles of the present invention.

Referring now to FIG. 3, a biphase code multiplex filter according to the principles of the present invention is described. A piezoelectric substrate 10 forms the basis for the filter. Input transducer 40 on substrate 10 is a four-bit biphase transducer. In this case, the spacing between adjacent electrode pairs 42 is identical to the spacing between the individual electrodes within each pair. Thus, a surface acoustic wave signal is generated which is time expanded by a factor of four and is phase coded according to the bit code of transducer 40. As above, the wavelength of the surface acoustic wave signal is determined by the electrode spacing. Output transducer 44 is a 127-bit biphase transducer comprising 127 electrode pairs 46 with a bit code as shown. As before, the spacing between adjacent electrode pairs 46 is substantially equal to the length of input transducer 40. The output electrical signal produced by transducer 44 is simply 127 repetitions of the waveform produced by input transducer 40 with the phase coding determined by the bit code of transducer 44. The processing gain of this code multiplex filter is the same as a conventional biphase filter having 508 electrode pairs in the output transducer, namely 27 dB. In the general case a code multiplex filter having an N bit input transducer and an M bit output transducer has a processing gain equal to that of a conventional biphase filter having an M×N bit output transducer while requiring only M+N electrode pairs. Since spurious signals due to multiple reflections and related processes are related to the total number of electrodes, this multiplicative effect provides an advantage in the processing gain versus performance trade-off of similar magnitude to that described with relation to the chirp-biphase filter above. Both the chirp-biphase and biphase code multiplex filters are referred to with the generic term compound matched filter.

Figure 4:
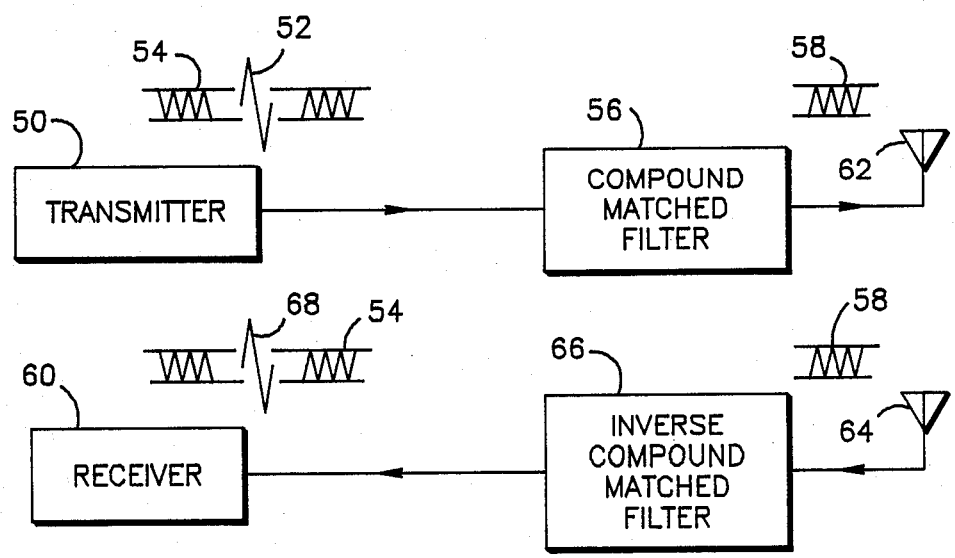
FIG. 4 is a schematic diagram of a secure communications system utilizing compound matched filters according to the principles of the present invention.

Referring now to FIG. 4, a secure communications system utilizing compound matched filters according to the present invention is shown. A transmitter 50 generates an output signal 52 which is to be communicated to a receiver 60. Output signal 52 rises significantly above a noise level 54. A compound matched filter 56 according to the principles of the present invention disperses output signal 52 into the noise background 54 and the resulting signal 58 is broadcast over antenna 62. As is apparent, it may not be necessary to have the signal level below the noise level at the transmitter, as is shown here. At the receiving station an antenna 64 receives signal 58 and inputs it to an inverse compound matched filter 66 which produces a correlation peak 68 which rises significantly above noise background 54 and which corresponds to the output signal 52 from transmitter 50. Receiver 60 is now able to detect correlation peak 68 as the received signal. Inverse filter 66 must be the time inverse of filter 56 in order to produce the proper correlation peak. One of the transducers of filter 66 must be the time inverse of the input transducer of filter 56 and the other transducer of filter 66 must be the time inverse of the output transducer of filter 56. Since the time inverse of any SAW transducer is simply the same transducer swapped end-for-end, it is possible to design devices with multiple transducers (e.g. chirp-biphase-chirp) which are appropriately connected at the transmitter and receiver ends of the system.

While the invention has been particularly shown and described with reference to a preferred embodiment thereof, it will be understood by those skilled in the art that various other modifications and changes may be made to the present invention without departing from the spirit and scope thereof.

We claim:
1. A compound matched filter comprising:
   a piezoelectric substrate;
   a first transducer on said substrate, said first transducer being adapted to respond to an input electrical signal and to produce surface acoustic waves on said substrate, said surface acoustic waves being time expanded and one of frequency dispersed and phase coded with respect to said input electrical signal; and
   a second transducer on said substrate, said second transducer being adapted to respond to said surface acoustic waves and to produce an output electrical signal, said output electrical signal being time expanded and phase coded with respect to said surface acoustic waves, an impulse response time of said first transducer being substantially equal to a bit time of said second transducer.

2. A compound matched filter comprising:
   a piezoelectric substrate;
   a first transducer on said substrate, said first transducer being one of a chirp and a biphase transducer; and
   a second transducer on said substrate, said second transducer being a biphase transducer, an impulse response time of said first transducer being substantially equal to a bit time of said second transducer.

3. A compound matched filter according to claim 1 wherein said first transducer is a chirp transducer.

4. A compound matched filter according to claim 2 wherein said first transducer is a chirp transducer.

5. A compound matched filter according to claim 1 wherein said first transducer is a biphase transducer.

6. A compound matched filter according to claim 2 wherein said first transducer is a biphase transducer.

7. A compound matched filter according to claim 1 wherein said first transducer comprises:

a plurality of interleaved electrodes, said electrodes being spaced a first distance apart at a first end of said transducer and being spaced a second distance apart at a second end of said transducer.

8. A compound matched filter according to claim 2 wherein said first transducer comprises:
a plurality of interleaved electrodes, said electrodes being spaced a first distance apart at a first end of said transducer and being spaced a second distance apart at a second end of said transducer.

9. A compound matched filter according to claim 1 wherein said first transducer comprises:
a plurality of interleaved electrode pairs, each of said electrode pairs having one of a first phase and a second phase, said phases being ordered according to a predetermined code.

10. A compound matched filter according to claim 2 wherein said first transducer comprises:
a plurality of interleaved electrode pairs, each of said electrode pairs having one of a first phase and a second phase, said phases being ordered according to a predetermined code.

11. A compound matched filter according to claim 1 wherein said second transducer comprises:
a plurality of interleaved electrode pairs, each of said electrode pairs having one of a first phase and a second phase, said phases being ordered according to a predetermined code, a distance between successive electrode pairs being substantially equal to a length of said first transducer.

12. A compound matched filter according to claim 2 wherein said second transducer comprises:
a plurality of interleaved electrode pairs, each of said electrode pairs having one of a first phase and a second phase, said phases being ordered according to a predetermined code, a distance between successive electrode pairs being substantially equal to a length of said first transducer.

13. In combination with a communication system having a transmitter and a receiver, a signal processing system comprising:
a first compound matched filter comprising a piezoelectric substrate, a first input transducer and a first output transducer, said first input transducer being one of a chirp and a biphase transducer and said output transducer being a biphase transducer, said first compound matched filter being connected to said transmitter; and
a second compound matched filter comprising a piezoelectric substrate, a second input transducer and a second output transducer, said second input transducer being a time inverse of one of said first input transducer and said first output transducer and said second output transducer being a time inverse of the other of said first input transducer and said first output transducer, said second compound matched filter being connected to said receiver.

* * * * *